US006417552B1

(12) United States Patent
Van Arendonk

(10) Patent No.: US 6,417,552 B1
(45) Date of Patent: Jul. 9, 2002

(54) SOLID-STATE IMAGING DEVICE

(75) Inventor: Anton Petrus Maria Van Arendonk, Eindhoven (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/691,820

(22) Filed: Oct. 19, 2000

(30) Foreign Application Priority Data

Oct. 21, 1999 (EP) .............................................. 99203455

(51) Int. Cl.$^7$ ......................... H01L 27/14; H01L 31/00
(52) U.S. Cl. ....................... 257/431; 257/433; 257/480; 438/57; 438/69; 438/70
(58) Field of Search ................................ 257/431, 433, 257/680; 438/57, 69, 70

(56) References Cited

U.S. PATENT DOCUMENTS 5,550,398 A * 8/1996 Kocian et al. .............. 257/434
5,616,949 A    4/1997 Watanabe ................... 257/434
5,945,721 A * 8/1999 Tatoh .......................... 257/434

FOREIGN PATENT DOCUMENTS

EP   0089044 A2   9/1983
WO   9950917 A1   10/1999

* cited by examiner

*Primary Examiner*—Vu A. Le
*Assistant Examiner*—Christian D. Wilson
(74) *Attorney, Agent, or Firm*—Steven R. Biren

(57) ABSTRACT

The invention relates to a solid-state imaging device (1) which is encapsulated in a ceramic package covered by a transparent window (6) comprising a phosphorus-containing glass. The window is provided with a coating (8), for example of chromium, at the circumference of the window to counteract degradation of the joint between the window and the ceramic package, which degradation results from the sensitivity of phosphorus glass to moisture. The use of phosphorus glass has the advantage that it is opaque to infrared radiation, so that the application of a separate coating serving as an IR filter is avoided and hence the dependence of the sensitivity of the imaging device on the angle of incidence of the radiation to be detected.

3 Claims, 1 Drawing Sheet

SOLID-STATE IMAGING DEVICE

BACKGROUND OF THE INVENTION

The invention relates to a solid-state imaging device comprising a semiconducting imaging element with a radiation-sensitive surface, which imaging element is provided in a housing which is covered, at the side facing the radiation-sensitive surface, with a window of a transparent material which is attached to the envelope by means of an adhesive. For the semiconducting imaging element use can be made of, for example, a CCD imager or a CMOS imager, and said imaging element may be both linear and two-dimensional. Two-dimensional imagers are employed in cameras, for moving pictures (TV) as well as for still pictures (photography). Linear imagers are used, for example, as scanners in, for example, facsimile apparatus.

To protect the semiconducting imaging element against atmospheric influences, in particular moisture, it is encapsulated in a housing, for example, of a ceramic material which, on the side where the light is incident, is covered in an airtight manner by a glass window. As ordinary glass transmits infrared radiation (IR), this glass window is customarily provided with a filter, for example a coating, which blocks infrared radiation, thereby precluding that this radiation reaches the photosensitive imaging element.

A drawback of known housings resides in that the transmission characteristics of the glass window and hence the sensitivity of the imaging device is angle-dependent. It is an object of the invention to provide, inter alia, an imaging device which is not angle-dependent.

To achieve this, an imaging device of the type described in the opening paragraph is characterized in accordance with the invention in that the transparent material includes a layer of phosphorus glass.

SUMMARY OF THE INVENTION

The invention is based, inter alia, on the recognition that the angle dependence in the characteristics of the customary glass window is caused by the IR filter and that it can be precluded by using a type of glass which does not transmit infrared radiation, so that such a filter on the glass is not necessary.

In practice, it has been found that degradation at the joint between the ceramic housing and the window may occur, which degradation may even result in breakage of this joint in the course of time. A preferred embodiment of an imaging device in accordance with the invention, wherein this drawback is obviated entirely, or at least substantially entirely, is characterized in that at least the side of the window facing the radiation-sensitive surface is provided with a coating which improves the bond between the window and the ceramic housing and which leaves free the part of the window via which an image is projected on the imaging element exposed. A specific embodiment is characterized in that the coating is provided in the form of a ring which extends along the edge of the window at the location where the window is attached to the ceramic housing. By providing the coating substantially at the edge of the glass cover, bonding problems are precluded while the transmission characteristics are not influenced by the coating.

For the coating use can be made of various materials. Very good results are achieved by using chromium.

These and other aspects of the invention will be apparent from and elucidated with reference to the embodiments described hereinafter.

DESCRIPTION OF THE PREFERRED EMBODIMENTS

Figure 1:
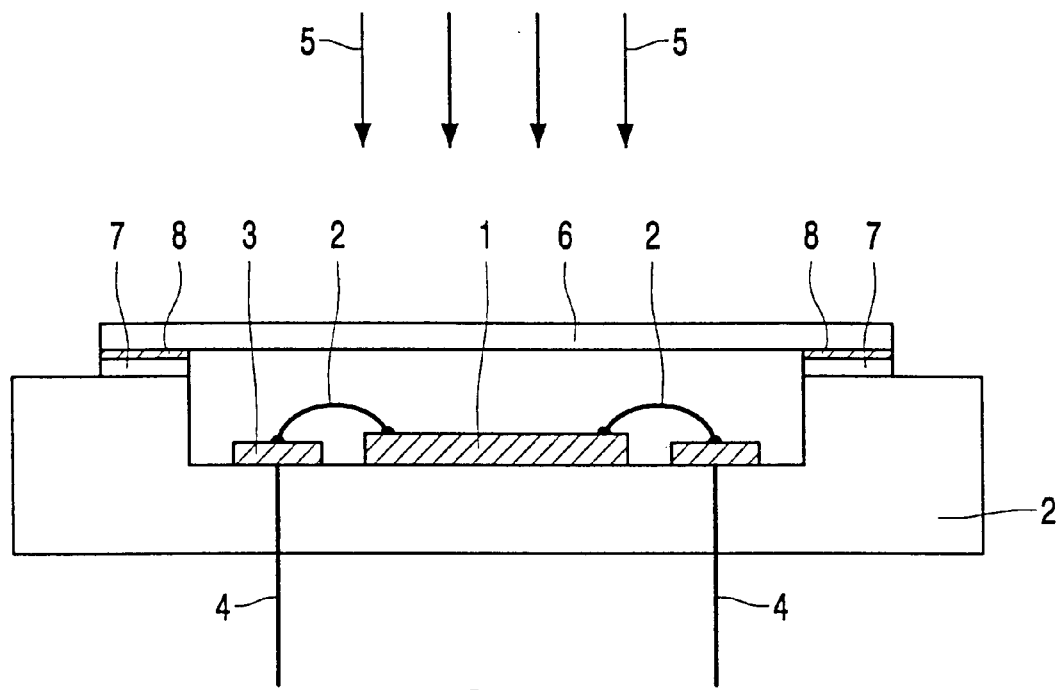
FIG. 1 is a sectional view of an imaging device in accordance with the invention.
Figure 2:
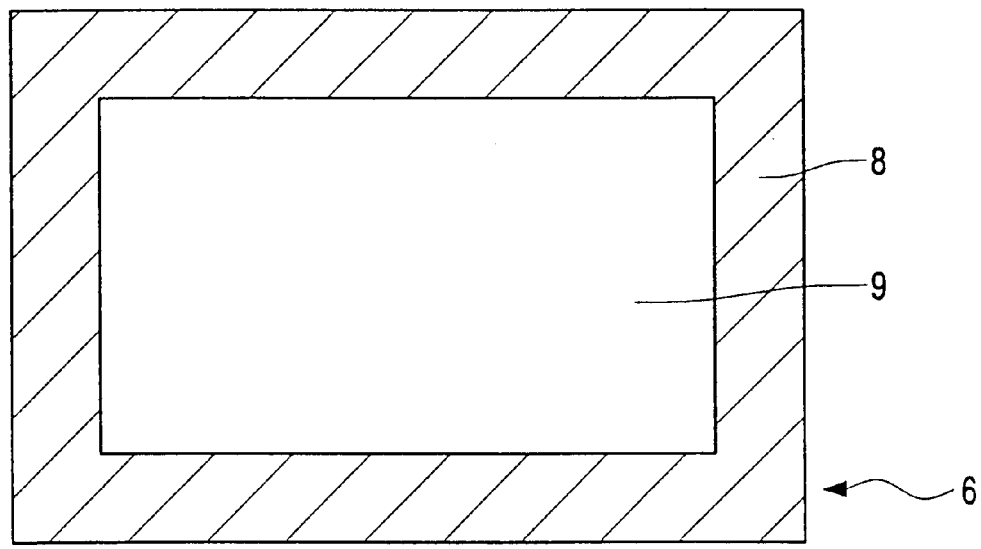
FIG. 2 is a plan view of the glass cover of this imaging device.

The imaging device shown in FIG. 1 comprises a semiconducting imaging element, for example a CCD imager 1, which is provided in a housing 2 of, for example, a customary ceramic material. The device may be used for black-and-white applications, but also for color applications. In the latter case, the surface of the imaging element is provided with a bar or mosaic color filter, not shown in the drawing. The imaging element is connected via bonding wires 2 and bonding surfaces 3 to external connection pins 4 which provide the external connection of the imaging element 1 for, inter alia, power supply and signal processing. On the side where the electromagnetic radiation 5 to be detected is incident, the housing 2 is provided with a transparent window which is hermetically sealed by means of a glass window or glass cover 6. The glass cover 6 is hermetically attached to the housing 2 by means of a glued joint 7, known per se, which extends along the edge of the window.

The composition of the window 6 is chosen to be such that visible light is maximally transmitted in connection with the sensitivity of the imager, while infrared radiation is blocked as much as possible. In accordance with the invention, for the window 6 use is made of a phosphorus-containing glass, hereinafter referred to as phosphorus glass for short, which is available from Schott under the name of BG18 or BG38. The thickness of the glass is, for example, 0.75 mm. The phosphorus glass absorbs infrared radiation, so that a coating necessary with customary glass windows can be omitted. As a result, it is precluded that the transmission characteristics for visible light are dependent upon the angle of incidence of the light.

It has been found that, in practice, degradation of the bond between the glass layer 6 and the ceramic housing 2 may occur if no additional measures are taken. Said degradation is possibly caused by the fact that phosphorus glasses are sensitive to moisture, causing the quality of the bond between the glue and the glass to deteriorate in the course of time. To preclude this problem, the glass plate 6 is provided, on the side facing the imaging element 1, with a coating 8 which improves the bond between the glass 6 and the ceramic housing 2 and which leaves free the central part 9 of the window 6 through which a radiation image is projected on the element 1. In the present example, the coating is provided in the form of a ring which extends substantially only along the edge of the window 6 at the location where the window is attached to the housing 2. By virtue of this construction, the sensitivity of the device is not influenced by the coating, and a material can be chosen for the coating 8 which has favorable bonding properties and which can be readily provided. In a practical embodiment, very favorable results are obtained using a coating 8 which is formed by a layer of chromium having a thickness of approximately 0.2 $\mu$m. The chromium layer may be provided in a manner which is known per se, for example by deposition from the gas phase (CVD) or by sputtering.

It will be clear that the invention is not limited to the above-described example, and that many variations are possible to those skilled in the art. For example, for the coating 8 use can be made of suitable materials other than chromium, such as aluminium or ITO (Indium Tin Oxide).

What is claimed is:

1. A solid-state imaging device comprising a semiconducting imaging element with a radiation-sensitive surface, which imaging element is provided in a housing which is covered, at the side facing the radiation-sensitive surface, with a window of a transparent material which is attached to the envelope by means of an adhesive, characterized in that the transparent material includes a layer of phosphorus glass, and in that at least the side of the window facing the radiation-sensitive surface is provided with a coating consisting of a layer of chromium which improves the bond between the window and the ceramic housing and which leaves the part of the window via which an image is projected on the imaging element exposed.

2. A solid-state imaging device as claimed in claim 1, characterized in that the coating is provided in the form of a ring which extends along the edge of the window at the location where the window is attached to the ceramic housing.

3. A solid-state imaging device as claimed in claim 1, characterized in that the device is provided with a color filter.

* * * * *